(12) United States Patent
Watanabe

(10) Patent No.: US 7,560,362 B2
(45) Date of Patent: Jul. 14, 2009

(54) CUTTING METHOD FOR SUBSTRATE

(75) Inventor: Shinya Watanabe, Tokyo (JP)

(73) Assignee: Disco Corporation, Tokyo (JP)

( * ) Notice: Subject to any disclaimer, the term of this patent is extended or adjusted under 35 U.S.C. 154(b) by 237 days.

(21) Appl. No.: 11/633,842

(22) Filed: Dec. 5, 2006

(65) Prior Publication Data

US 2007/0134889 A1 Jun. 14, 2007

(30) Foreign Application Priority Data

Dec. 8, 2005 (JP) .............................. 2005-354837

(51) Int. Cl.
*H01L 21/00* (2006.01)
(52) U.S. Cl. .................. 438/462; 438/460; 438/463; 257/E21.001
(58) Field of Classification Search .......... 438/460–465
See application file for complete search history.

(56) References Cited

U.S. PATENT DOCUMENTS

| 4,217,689 | A | * | 8/1980 | Fujii et al. ................... 438/465 |
| 4,616,966 | A | * | 10/1986 | Ohyama ...................... 409/132 |
| 4,793,101 | A | * | 12/1988 | Dlouhy et al. ................. 451/44 |
| 6,659,843 | B2 | * | 12/2003 | Boucher et al. ............... 451/12 |
| 7,247,524 | B2 | * | 7/2007 | Nakagawa .................. 438/118 |
| 2006/0014320 | A1 | * | 1/2006 | Yamano et al. ............. 438/113 |
| 2006/0109757 | A1 | * | 5/2006 | Nishiwaki et al. ......... 369/44.14 |
| 2007/0134890 | A1 | * | 6/2007 | Watanabe .................... 438/462 |
| 2007/0231929 | A1 | * | 10/2007 | Kajiyama et al. .............. 438/6 |

FOREIGN PATENT DOCUMENTS

| JP | 11-054461 | 2/1999 |
| JP | 2000-173961 A | 6/2000 |

* cited by examiner

*Primary Examiner*—Alexander G Ghyka
*Assistant Examiner*—Angel Roman
(74) *Attorney, Agent, or Firm*—Brinks Hofer Gilson & Lione

(57) ABSTRACT

A cutting method for substrates includes: preparing a substrate having a predetermined circular cut line which is set thereon; chucking the substrate on a surface of a chuck table which is rotatably provided; and cutting the substrate along the predetermined circular cut line of the substrate by rotating a disc-shaped cutting blade. In the cutting, the cutting blade is disposed beforehand laterally away from a side of the substrate in a surface direction of the substrate and is disposed beforehand at a position in a thickness direction of the substrate, the position corresponding to a cut depth by the cutting blade to the substrate. Next, the cutting blade is moved relatively from the above condition toward the substrate in a tangential direction of the substrate so as to enter from an edge of the substrate to a cutting start point of the substrate. Next, the substrate is rotated together with the chuck table and the cutting blade cuts the substrate along the predetermined circular cut line, so that the cutting is performed on the substrate.

5 Claims, 5 Drawing Sheets

CUTTING METHOD FOR SUBSTRATE

This application claims priority under 35 U.S.C. §119 to Japanese Patent Application No. JP2005-354837 filed Dec. 8, 2005, the entire content of which is hereby incorporated by reference.

BACKGROUND OF THE INVENTION

1. Field of the Invention

The present invention relates to a cutting method for substrates in which the cutting of the substrates is performed and the forming of grooves on substrates (for example, semiconductor wafers) by using a cutting blade.

2. Description of the Related Arts

Semiconductor devices (for example, semiconductor chips) are produced by the following processes. That is, a wafer (for example, a semiconductor wafer) which is composed of a semiconductor substrate material is prepared. Grid-like predetermined division lines are formed on a surface of the wafer, so that plural rectangular device regions are defined by the predetermined division lines on the surface of the wafer. Next, electronic circuits (for example, Integrated Circuits (=ICs) and Large Scale Integrations (=LSIs)) are formed on the device regions. Next, a rear surface of the wafer is ground, so that the wafer is thinned to have a desired thickness. Next, the wafer is divided along the predetermined division lines. As a result, the semiconductor devices (for example, semiconductor chips) are produced. In the above processes, in order to prevent the occurrence of damage (for example, cracking and breakage) in the wafer during handling of the wafer, a circumferential edge of the wafer may be chamfered before the thinning of the wafer.

When a wafer having a chamfered circumferential edge is thinned, the circumferential edge in a cross section is outwardly sharper and thinner so as to have a knife edge shape. Since the same damage may easily occur again in the above condition of the circumferential edge, the circumferential edge is subjected to cutting before thinning of the wafer so as not to have a knife edge shape, so that the circumferential edge has a surface which extends along a thickness direction of the wafer (which extends perpendicularly to a surface of the wafer) as disclosed in Japanese Unexamined Patent Application Publication No. 2000-173961. If damage (for example, cracking and breakage) occurs at the circumferential edge, the circumferential edge may be the origin of damage which extends to device regions having electronic circuits formed thereon, and the wafer itself may break and become unusable. Therefore, the above cutting of the circumferential edge is advantageous.

The cutting for preventing the generation of a knife edge shape is performed by forming either a ring-shaped step or a circular groove on a circumferential edge proximate to a surface of a chamfered wafer before thinning. The step and the groove have circular shapes which have diameters corresponding to a diameter of the wafer finally obtained and which have depths corresponding to a desired thickness of the wafer obtained after thinning. When a rear surface of the wafer is thinned by grinding, the circumferential edge does not have a knife edge shape and has a surface extending along a thickness direction as disclosed in Japanese Unexamined Patent Application Publication No. 2000-173961 (in particular, FIGS. 2 to 4).

The above cutting of the circumferential edge uses the following method. That is, a wafer is held horizontally so that a surface thereof faces upward. A cutting blade, which is rotated at a high speed and is positioned above the wafer, is moved downward and cuts a layer of the wafer, which has a predetermined depth from the surface thereof, at a cutting start point on the wafer. From this condition, the cutting blade is rotated relatively to the wafer, thereby cutting the wafer in a horizontal direction.

In addition, in the field of semiconductor devices, there is a case in which a wafer having a small diameter is obtained from a wafer having a relatively large diameter by cutting. In this case, a cutting blade is moved downward and then cuts a layer, which has a predetermined depth from a surface of the wafer, in a horizontal direction as disclosed in Japanese Unexamined Patent Application Publication No. H11-54461.

The cutting blade disclosed in Japanese Unexamined Patent Application Publications described above is coaxially provided at an end of a spindle having a rotation shaft. In general, the spindle is movably supported by a frame or the like in a horizontal direction, which extends along an axis of the spindle, and in a vertical direction while the axis thereof is maintained in a horizontal direction. In general, in the moving of the cutting blade, the downward speed of the cutting blade is relatively slower than the horizontal speed thereof. In addition, when the cutting blade cuts the wafer, there is a limit to setting the downward speed of the cutting blade to be faster in order to prevent a warp of the cutting blade due to a large load applied thereon. Due thereto, the downward speed of the cutting blade is small, the moving of the cutting blade to the cutting start point on the wafer is time-consuming for manufactures, and production efficiency is not good.

SUMMARY OF THE INVENTION

An object of the present invention is to provide a cutting method for substrates, which can set a cutting speed of a cutting blade to the substrate to be faster when performing cutting and forming grooves on the substrate (for example, semiconductor wafers) by using the cutting blade and thereby can improve production efficiency.

According to one aspect of the present invention, a cutting method for substrates includes: preparing a substrate having a predetermined circular cut line which is set thereon; chucking the substrate on a surface of a chuck table which is rotatably provided; and cutting the substrate along the predetermined circular cut line of the substrate by rotating a disc-shaped cutting blade. In the cutting, the cutting blade is disposed beforehand laterally away from a side of the substrate in a surface direction of the substrate and is disposed beforehand at a position in a thickness direction of the substrate, the position corresponding to a cut depth by the cutting blade to the substrate. Next, the cutting blade is moved relatively from the above condition toward the substrate in a tangential direction of the substrate so as to enter from an edge of the substrate to a cutting start point of the substrate. Next, the substrate is rotated together with the chuck table and the cutting blade cuts the substrate along the predetermined circular cut line, so that the cutting is performed on the substrate.

In the cutting method of the present invention, the cutting blade disposed laterally away from a side of the substrate is moved relatively to the substrate and enters from the edge of the substrate to the cutting start point. In this case, the entry direction of the cutting blade is parallel to the tangential direction of the predetermined circular cut line set on the substrate. For example, in a typical apparatus structure using a cutting blade having a horizontal rotation axis, the entry direction of the cutting blade is a horizontal direction. That is, in the cutting method of the present invention, the entry direction of the cutting blade into the substrate is not a thickness direction of the substrate (downward direction) used in the conventional techniques, and is a surface direction of the substrate (horizontal direction), which is perpendicular to the thickness direction of the substrate.

Since the cutting blade disposed laterally away from a side of the substrate enters the substrate from the edge of the substrate along the surface direction of the substrate in the above manner, the cutting blade can reach the cutting start point of the substrate in the cutting method of the present invention faster than in the conventional technique using the downward entry of the cutting blade. Since a load applied to the cutting blade is smaller in the present invention using the lateral entry of the cutting blade than in the conventional technique using the downward entry of the cutting blade, the entry speed of the cutting blade can be faster. Due thereto, the cutting speed of the cutting blade to the substrate can be faster, so that production efficiency can be improved.

The cutting by the cutting blade may use the following cutting features. That is, the substrate may be disc-shaped by completely cutting and removing a circumferential edge therefrom. A ring-shaped groove or a ring-shaped step may be formed on a substrate by cutting in order to prevent formation of a knife edge shape thereon.

An upper limit of an entry speed of the cutting blade into the substrate may be variated depending on the edge thickness of the cutting blade. According to a preferred embodiment, the entry speed of the cutting blade into the substrate is about 1 to 10 mm/sec. The reason for this is as follows. That is, when the entry speed is less than 1 mm/sec and therefore is the same speed as that in the conventional technique using the downward entry of the cutting blade, the effects of the present invention cannot be obtained. When the entry speed exceeds 10 mm/sec, cutting quality by the cutting blade may be deteriorated.

In the cutting method of the present invention, since the cutting blade disposed laterally away from a side of the substrate enters the substrate in the tangential direction of the predetermined cut line, the cutting blade can reach the cutting start point of the substrate faster than in the conventional technique using downward entry of the cutting blade. As a result, production efficiency can be improved.

DESCRIPTION OF THE PREFERRED EMBODIMENTS

An embodiment of the present invention will be explained hereinafter with reference to the drawings.

1. Semiconductor Wafer

Figure 1A:
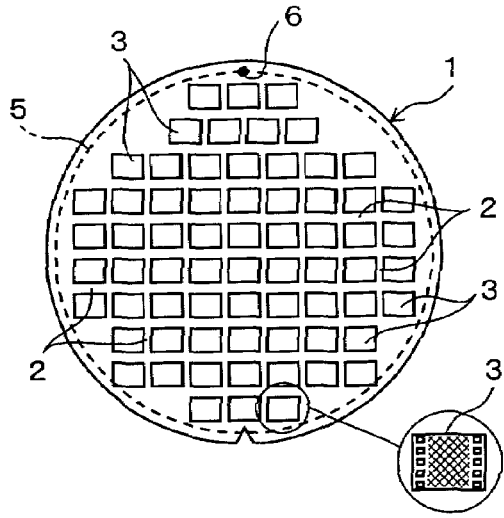
FIGS. 1A and 1B are an overall plan view and a side view which show a semiconductor wafer in one embodiment according to the present invention, and an enlarged portion in FIG. 1A shows a semiconductor chip.
Figure 1B:

FIGS. 1A and 1B show a disc-shaped semiconductor wafer 1 (hereinafter referred to simply as "wafer 1") which is a substrate in the embodiment. The wafer 1 is a silicon wafer or the like and has a thickness of about 600 to 700 µm. As shown in FIG. 1B, a circumferential edge of the wafer 1 is chamfered to have a curvature in a cross section. Grid-like predetermined division lines 2 are formed on a surface of the wafer 1 so that plural rectangular semiconductor chips 3 are defined by the predetermined division lines 2 on the surface of the wafer 1. Electronic circuits (for example, Integrated Circuits (=ICs) and Large Scale Integrations (=LSIs)) are formed on surfaces of the semiconductor chips 3.

Figure 2:
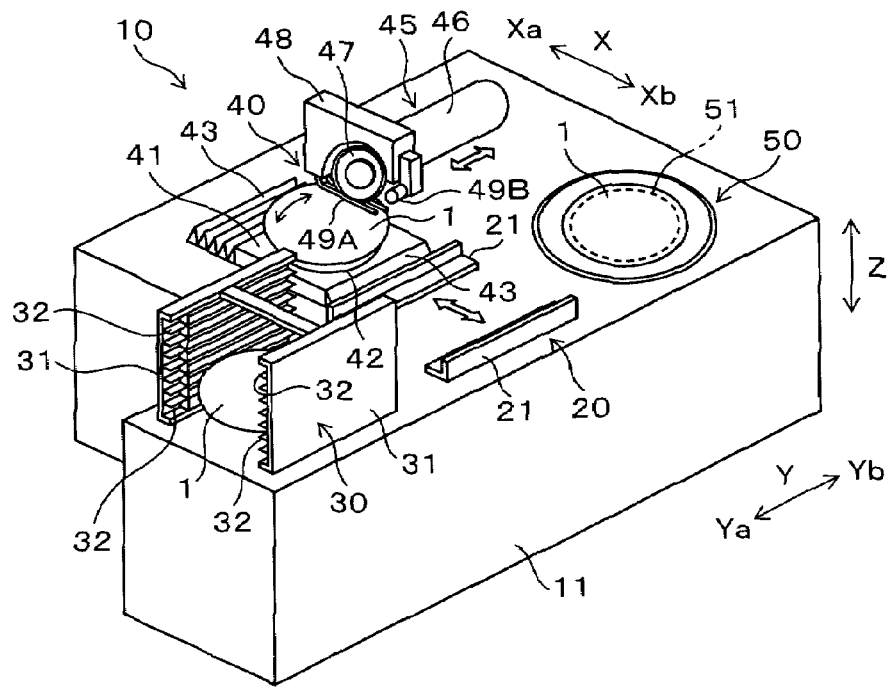
FIG. 2 is a perspective view of a cutting apparatus desirably used for performing the embodiment.

A rear surface of the wafer 1 is ground so that the wafer 1 is thinned to have a desired thickness (for example, about 50 to 100 µm). Next, the wafer 1 is cut along the predetermined division lines 2 and is divided into the semiconductor chips 3. The embodiment uses a cutting method for preventing formation of a knife edge at the circumferential edge of the wafer 1 after the thinning by using a cutting apparatus 10 as shown in FIG. 2. The cutting apparatus 10 will be described hereinafter.

2. Cutting Apparatus

The cutting apparatus 10 is equipped with an approximately rectangular parallelepiped pedestal 11. A positioning mechanism 20 is provided on a flat upper surface of the pedestal 11. A cassette 30, a cutting mechanism 40, and a cleaning unit 50 are disposed around the positioning mechanism 20 in a clockwise direction. Plural wafers 1 are disposed at a predetermined position on the pedestal 11 while being provided in the cassette 30. As shown in FIG. 2, an X direction denotes one side direction of the pedestal 11 and a Y direction denotes another side direction of the pedestal 11. In addition, "a" or "b" is added to one direction or another direction of the X and Y directions. In particular, when directions are specified, reference symbols (Xa, Xb, Ya, Yb) are appropriately used.

One wafer 1 is ejected from the cassette 30. The wafer 1 is moved to the cutting mechanism 40 via the positioning mechanism 20, and a circumferential edge of the wafer 1 is cut by the cutting mechanism 40. Next, the wafer 1 is moved to the cleaning unit 50 via the positioning mechanism 20, and is cleaned by the cleaning unit 50. The cleaned wafer 1 is moved again, and is returned to the cassette 30 via the positioning mechanism 20. A moving robot (not shown in FIG. 2) is provided on the pedestal 11. The cassette 30, the positioning mechanism 20, the cutting mechanism 40, and the cleaning unit 50 will be explained hereinafter in accordance with the moving order of the wafer 1.

A. Cassette

The cassette 30 can be transported. Plural wafers 1 are laminated and provided in the cassette 30. The cassette 30 is removably provided in a predetermined cassette setting portion. The cassette 30 has a pair of cases 31 which are parallel to and apart from each other. Plural racks 32 are provided on internal surfaces of the cases 31, which face each other, in a vertical direction. The wafers 1 are slidably inserted in the racks 32 such that surfaces of the wafers 1 face upward and are in a horizontal position. The cassette 30 is set on the cassette setting portion on the pedestal 11 such that sliding directions of the wafers 1 are parallel to the Y direction. The wafers 1 in the cassette 30 are moved to the positioning mechanism 20 by the above moving robot.

B. Positioning Mechanism

The positioning mechanism 20 has a pair of guide bars 21 which extends in the Y direction and which are movable toward and counter to each other in cooperation in the X direction perpendicular to the Y direction. The wafers 1 are disposed between the guide bars 21 on the pedestal 11. The wafers 1 are held by the guide bars 21 which move toward each other, so that relay positions with respect to the cutting mechanism 40, the cleaning unit 50, and the cassette 30 are determined.

C. Cutting Mechanism

The cutting mechanism 40 is equipped with a rectangular table base 41, a disc-shaped chuck table 42 which is rotatably provided on the table base 41, and a cutting unit 45 which is disposed above the chuck table 42. The table base 41 is movable in the X direction via a guide rail (not shown in FIG. 2) on the pedestal 11, and is reciprocated by a reciprocating mechanism (not shown in FIG. 2). The chuck table 42 has a flat upper surface. The chuck table 42 is supported by the table base 41 to be rotatable around a Z direction (vertical direction), and is rotated by a rotation driving mechanism (not shown in FIG. 2) in a clockwise direction or in a counter-clockwise direction.

The chuck table 42 is a typical vacuum chuck type. The chuck table 42 has many small chucking holes which communicate between a surface of the chuck table 42 and a rear surface thereof. An air drawing opening of a vacuum apparatus (not shown in FIG. 2) is disposed on the rear surface of the chuck table 42. The wafer 1 is disposed on the upper surface of the chuck table 42, and is chucked and held thereon by operating the vacuum apparatus. A cornice-shaped cover 43 is stretchably provided on both ends of the moving direction of the table base 41. The cornice-shaped cover 43 covers the moving path of the table base 41 so as to prevent intrusion of dust and waste thereinto.

The cutting unit 45 is equipped with a cylindrical spindle 46 and a cutting blade 47. The spindle 46 is provided such that an axial direction thereof is parallel to the Y direction. The cutting blade 47 is mounted to an end portion (which is on a side of the Ya direction in FIG. 2) of the spindle 46. The cutting blade 47 has an edge thickness of about 0.1 mm. The spindle 46 has a rotation shaft, a motor and the like which are provided therein and are not shown in FIG. 2. The motor rotates the rotation shaft. The cutting blade 47 is fixed on the rotation shaft. The spindle 46 is supported by a frame, which is provided on the pedestal 11 and is not shown in FIG. 2, so as to reciprocate in the Y direction and move upwardly and downwardly in the Z direction in the condition that the axial direction of the spindle 46 is parallel to the Y direction. A driving mechanism (not shown in FIG. 2) is provided on the frame and moves the spindle 46 in the above directions. A blade cover 48 is provided on an end portion of the spindle 46 proximate to the cutting blade 47. Cutting water nozzles 49A and 49B are provided on the blade cover 48 and supplies cutting water to the wafer 1 for lubricating, cooling, cleaning, and the like in the cutting.

In the above structured cutting mechanism 40, the wafer 1 is chucked and held on the chuck table 42, and the wafer 1 is cut by the cutting blade 47. A cutting position of the cutting blade 47 into the wafer 1 in the Y direction is adjusted by moving the spindle 46 in the Y direction. A cut depth by the cutting blade 47 into the wafer 1 is adjusted by moving the spindle 46 in the Z direction. The cutting is performed in the X direction by moving the table base 41 in the X direction. The cutting is performed in the circumferential direction by rotating the chuck table 42.

D. Cleaning Unit

The cleaning unit 50 is equipped with a chuck table 51, a cleaning water nozzle (not shown in FIG. 2) and an air nozzle (not shown in FIG. 2). The chuck table 51 is the same type as the chuck table 42 of the cutting mechanism 40. The cleaning water nozzle and the air nozzle are provided around the chuck table 51. The chuck table 51 chucks and holds the wafer 1 on a flat upper surface thereof, and is rotated at a high speed by a rotation driving mechanism (not shown in FIG. 2). Cleaning water is sprayed from the cleaning water nozzle onto the wafer 1 which is held and rotated on the chuck table 51 at a high speed, so that the wafer 1 is cleaned. Then, the rotation of the chuck table 51 is continued and the spraying of the cleaning water is stopped. As a result, the cleaning water is spun out, and the air is blown onto the wafer 1 from the air nozzle, so that the cleaned wafer 1 is dried.

3. Action of Cleaning Apparatus

Figure 3A:
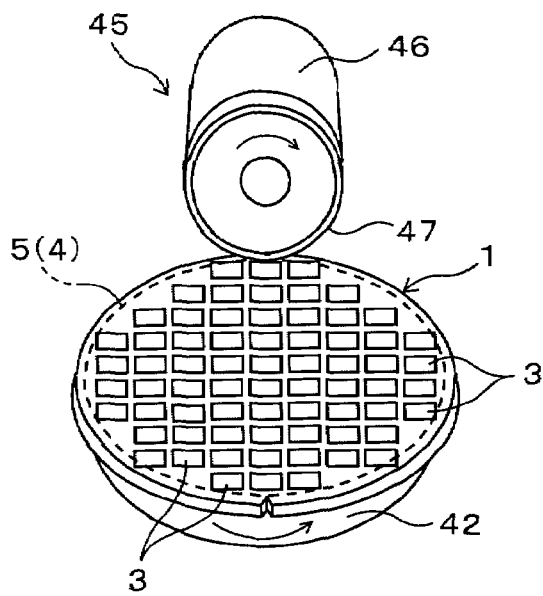
FIG. 3A is a perspective view showing a groove is formed on a circumferential edge of the wafer by a cutting blade of the cutting apparatus and FIG. 3B is a cross sectional view showing the wafer having the groove formed thereon.
Figure 3B:
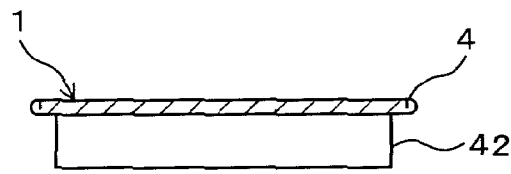
Figure 4:
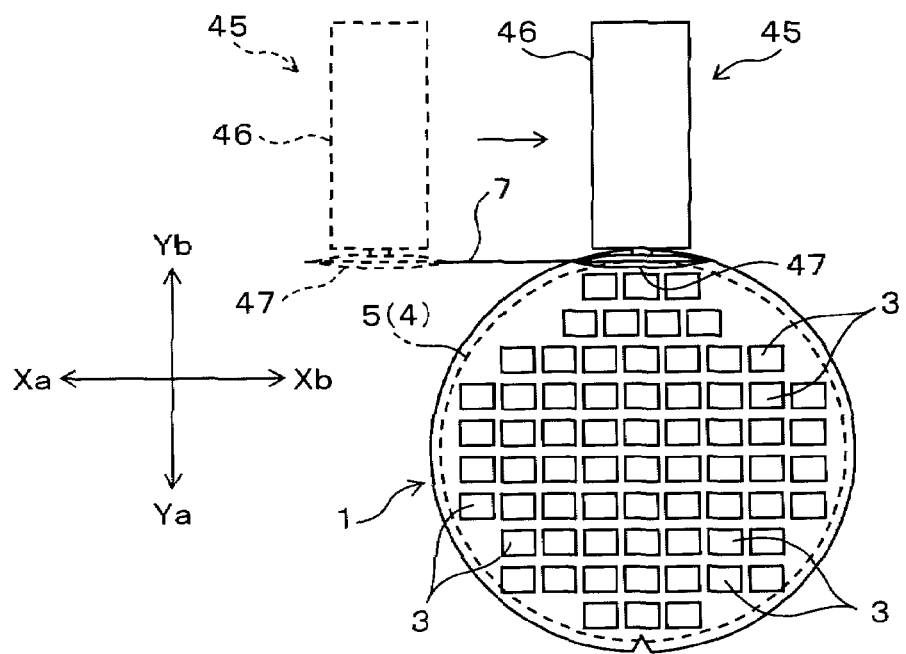
FIG. 4 is a plan view showing a condition in which the cutting blade enters the wafer.

Next, actions of the above cutting apparatus 10 will be explained hereinafter. As described above, the embodiment uses the cutting method for preventing formation of a knife edge shape at the circumferential edge of the wafer 1 which is after the thinning by using the cutting apparatus 10. In this cutting method, as shown in FIGS. 3A, 3B, 4 and 5A, a circular groove 4 is formed on an entire circumferential edge on the surface of the wafer 1. As shown in FIGS. 3A, 3B and 4, dotted lines 5 denote a portion in which the groove 4 is intended to be formed, and show an external form of the wafer 1 which is finally intended to be obtained. The dotted lines 5 are predetermined cut lines for forming the groove 4 on the wafer 1 which is held on the chuck table 42 of the cutting mechanism 40.

In the cutting by the cutting apparatus 10, first, one wafer 1 provided in the cassette 30 is horizontally disposed between the two guide bars 21 of the positioning mechanism 20 by the above moving robot. In this case, the surface of the wafer 1 faces upward. Next, the two guide bars 21 move toward each other in cooperation. When the two guide bars 21 contact the wafer 1 and the wafer 1 is sandwiched therebetween, the movements of the two guide bars 21 are stopped. Thus, the wafer 1 is positioned at a moving start position for moving the wafer 1 to the chuck table 42 of the cutting mechanism 40.

The chuck table 42 is driven to chuck beforehand. The wafer 1 is moved to the chuck table 42 by the moving robot, and is chucked and held by the chuck table 42. In this case, the above predetermined cut line 5 is set. The predetermined cut line 5 has a circular shape which has a diameter concentric with the rotation center of the chuck table 42 and which surrounds plural regions for forming the semiconductor chips 3. A cutting start point 6 is set at a point of the predetermined cut line 5, which is the most proximate to the side of the Yb direction, that is, at a point away from the rotation center of the chuck table 42 in the Yb direction by a radius of the wafer 1 which is finally intended to be obtained as shown in FIG. 1A.

Next, the table base 41 is appropriately moved in the X direction and the cutting unit 45 is appropriately moved in the Y direction and in the Z direction, so that the position of the cutting blade 47 with respect to the wafer 1 is determined at a cutting start position corresponding to the cutting start point 6. As shown in FIG. 4, the cutting start position is set at the same position as the cutting start point 6 in the Y direction, is set at an arbitrary position which is laterally away from the wafer 1 in the Xa direction, and is set at a position in the Z direction such that a cut depth by the cutting blade 47 corresponds to a desired thickness of the wafer 1 after thinning. That is, the cutting blade 47 is disposed on a tangential line 7 of the predetermined cutting line 5, which extends from the cutting start point 6 in the Xa direction.

After the cutting blade 47 is set at the cutting start position in the above manner, the cutting blade 47 is rotated at a high speed, and then the table base 41 is moved at a constant speed in the Xa direction. As a result, the cutting blade 47 relatively enters from the circumferential edge of the wafer 1 in the Xb direction and cuts the wafer 1. When the cutting blade 47 reaches the cutting start point 6, the movement of the table base 41 is stopped. As shown in FIG. 4, a groove is formed on the wafer 1 which the cutting blade 47 enters in the above manner. In this case, the groove extends from the entry point of the cutting blade 47 to the cutting start point 6 in the X direction which extends along the tangential line 47. The groove is positioned more outwardly than the predetermined cutting line 5. The formed speed of the groove on the wafer 1 by the cutting blade 47, that is, the moving speed of the table base 41 in the Xa direction is set at 1 to 10 mm/sec.

Next, while the stopping of the table base 41 is maintained and the rotating of the cutting blade 47 is continued, the wafer 1 is rotated by rotating the chuck table 42 in one direction, and the cutting blade 47 cuts the wafer 1 along the predetermined cutting line 5. In this case, the rotating speed of the chuck table 42, that is the cutting speed of the cutting blade 47 is set at 1 to 10 mm/sec which is the same as that in the entry of the cutting blade 47. When one rotation of the wafer 1 is performed and the cutting blade 47 returns the cutting start point 6, a circular groove 4 is formed along the predetermined cutting line 5. After the groove 4 is formed, the cutting blade 47 is moved upward to a waiting position.

The wafer 1, which has the groove 4 formed on the entire circumferential edge for preventing formation of a knife edge thereat in the above manner, is moved again to the positioning mechanism 20 by the moving robot. After a moving start point of the wafer 1 with respect to the chuck table 51 of the cleaning unit 50 is determined by the positioning mechanism 20, the wafer 1 is moved to the chuck table 51 of the cleaning unit 50 by the moving robot. The wafer 1 is chucked and held on the chuck table 51. Then, while the chuck table 51 is rotated at a high speed, cleaning water is sprayed from the cleaning water nozzle onto the rotated wafer 1 for a predetermined time period. Thus, the water which exists on the surface of the wafer 1 and the formed groove 4 is spin out, and cut waste and dust are removed from the wafer 1, so that the wafer 1 is cleaned.

Then, while the rotation of the chuck table 51 is continued, the air is blown from the air nozzle onto the wafer 1, so that the wafer 1 is dried. The wafer 1 cleaned in the above manner is moved from the cleaning unit 50 to the cassette 30 via the positioning mechanism 20 by the moving robot. The wafer 1 in the cassette 30 is moved to a thinning process by grinding a rear surface of the wafer 1.

Figure 6:
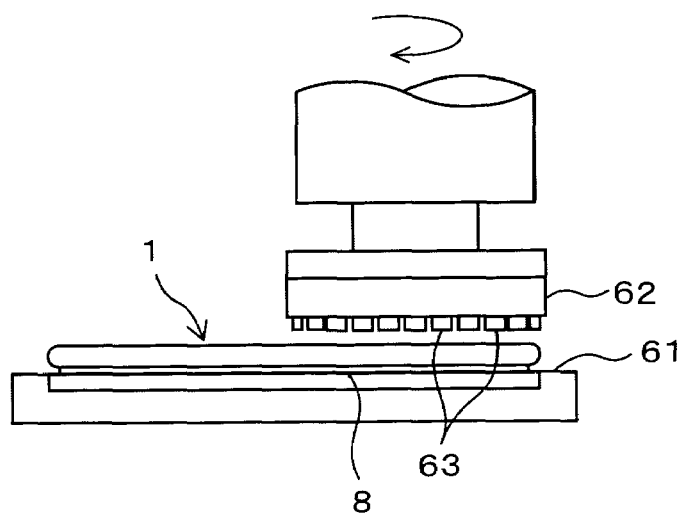
FIG. 6 is a side view showing the thinning process for grinding the rear surface of the wafer.

In the thinning process, as shown in FIG. 6, the wafer 1 having a protective tape 8 applied on the rear surface thereof is chucked and held on a vacuum chuck type chuck table 61 via the protective tape 8. The surface of the wafer 1 is pressed by a grinding stone 63 of grinding wheel 62 which is rotated at a high speed. Thus, the rear surface of the wafer 1 is ground.

Figure 5A:
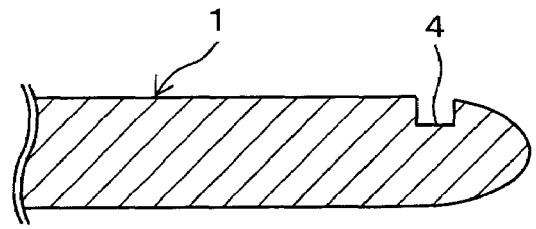
FIG. 5A is a cross sectional view showing a process for forming the groove on the circumferential edge of the wafer.
Figure 5B:
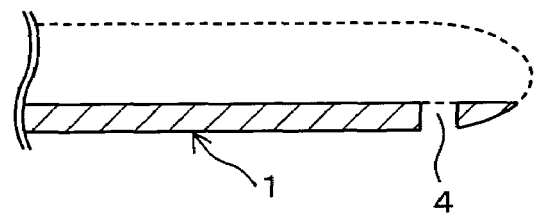
FIG. 5B is a cross sectional view showing a thinning process for grinding a rear surface of the wafer.
Figure 5C:
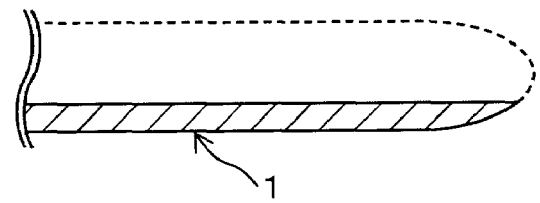
FIG. 5C is a cross sectional view showing a thinned wafer which was not subjected to the process for forming the groove thereon.

After the rear surface of the wafer 1 is ground and the wafer 1 has a desired thickness, as shown in FIG. 5B, the circumferential edge of the wafer 1, which is disposed outwardly from the groove 4, is separated and removed from the wafer 1. A new circumferential edge is formed on an internal surface of the groove 4 which extends in a thickness direction of the wafer 1. This is because the depth of the groove 4 corresponds to the desired thickness of the wafer 1. Therefore, the depth of the groove 4 should correspond to the desired thickness of the wafer 1 after the thinning, and may be deeper than the desired thickness of the wafer 1. If the wafer 1 is subjected to thinning without the groove 4 formed in the same manner as in the conventional technique, as shown in FIG. 5C, the circumferential edge is sharper so as to have a knife edge shape, and damage (for example, cracking and breakage) easily occurs. The dotted line shown in FIGS. 5A to 5C denotes a ground portion of the wafer 1.

As explained above, the cutting blade 47 horizontally enters the wafer 1, which is held horizontally, from the circumferential edge of the wafer 1, so that the cutting blade 47 can reach the cutting start point 6 in the embodiment faster than in the conventional technique in which the entry of the cutting blade into the wafer is performed by moving downward.

For example, since a cut depth by the cutting blade 47 is required to set to the level of microns, the downward speed of the cutting unit 45 is relatively small (for example, 0.05 mm/sec). However, since the horizontal movement of the cutting unit 45 is allowed to be relatively approximate, the horizontal speed is set at about 1 to 10 mm/sec as described above. In addition, since a load to the cutting blade 47 is smaller in the lateral entry into the wafer 1 than in the downward entry into the wafer 1, the entry speed of the cutting blade 47 can be faster. Due thereto, the entry speed of the cutting blade 47 can be faster by using the lateral entry of the cutting blade 47, so that the time consumption in the cutting can be reduced and the production efficiency can be improved.

4. Cutting for Forming Step Instead of Groove

Figure 7A:
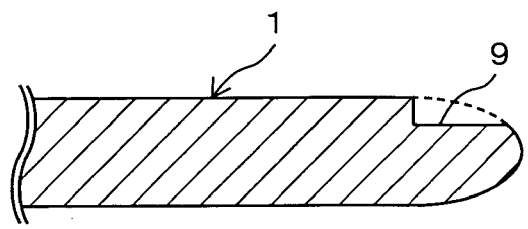
FIG. 7A is a cross sectional view showing a process for forming a step on the circumferential edge of the wafer.
Figure 7B:
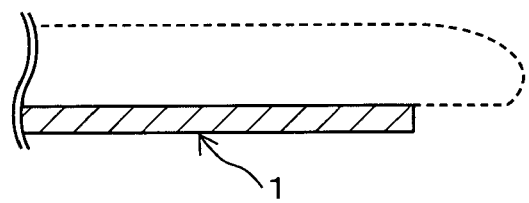
FIG. 7B is a cross sectional view showing a thinning process for grinding the rear surface of the wafer.

In the above embodiment, the groove 4 is formed by the cutting on the circumferential edge of the wafer 1 in order to prevent formation of a knife edge thereat. Instead of the groove 4, a step 9 shown in FIG. 7A is formed so that the same effects as in the above embodiment can be obtained. In order to form the step 9, the cutting blade 47 of the cutting unit 45 has an edge thickness (for example, about 0.5 mm) which is thicker than that in the above embodiment. Next, in the same manner as in the above embodiment, a surface of the cutting blade 47 on a side of the Ya direction is positioned on the predetermined cut line 5, enters the wafer 1 from the side which is lateral thereto, and cuts the wafer 1 from the circumferential edge of the wafer 1 to the cutting start point 6, and then the wafer 1 is rotated once. In this case, the edge thickness of the cutting blade 47 is set such that the edge of the cutting blade 47 projects outwardly from the circumferential edge. An unnecessary circumferential edge is cut and removed by forming the step 9. Next, the rear surface of the wafer 1 is thinned by grinding, so that the wafer 1 has no knife edge as shown in FIG. 7B.

5. Cutting for Removing Circumferential Edge

Figure 8A:
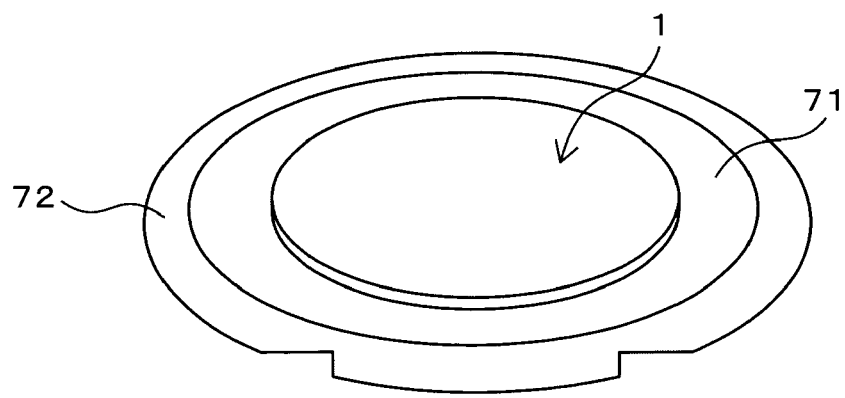
FIGS. 8A and 8B are a perspective view and a cross sectional view showing a semiconductor wafer supported by a dicing frame via a dicing tape.
Figure 8B:

In the above embodiments, the groove 4 or the step 9 is formed by the cutting at the circumferential edge on the surface of the wafer 1 in order to prevent formation of a knife edge thereat when the wafer is thinned. Alternatively, the cutting for removing the entire circumferential edge and machining the wafer 1 to have a desired diameter before thinning of the wafer 1 can be performed by the lateral entry of the wafer 1 in the same manner as in the above embodiments. In this case, it is inappropriate for the wafer 1 to be directly mounted on the chuck table 42 of the cutting mechanism 40 since the cutting blade 47 would penetrate the wafer 1 by the cutting and would contact the upper surface of the chuck table 42. Therefore, as shown in FIG. 8, a dicing tape 71 is applied to the rear surface of the wafer 1 and the cut depth by the cutting blade 47 is set such that the cutting blade 47 cuts a layer of the dicing tape 71.

The dicing tape 71 is an adhesive tape which has a circular shape larger than that of the wafer 1 and has an adhesive surface. The dicing tape 71 has a base film and an adhesive coated on a surface of the base film. For example, the base film of the dicing tape 71 is composed of polyvinylchloride and has a thickness of about 100 μm. The adhesive is composed of acrylic resin and has a thickness of about 5 μm. Since it is difficult to handle the wafer 1 when the dicing tape 71 is used in the above condition, a dicing frame 72 which is composed of a ring-shaped plate of metal (for example, stainless steel) is applied to a circumferential edge of the adhesive surface of the dicing tape 71, so that the wafer 1 can be handled by holding the dicing frame 72.

Figure 9:
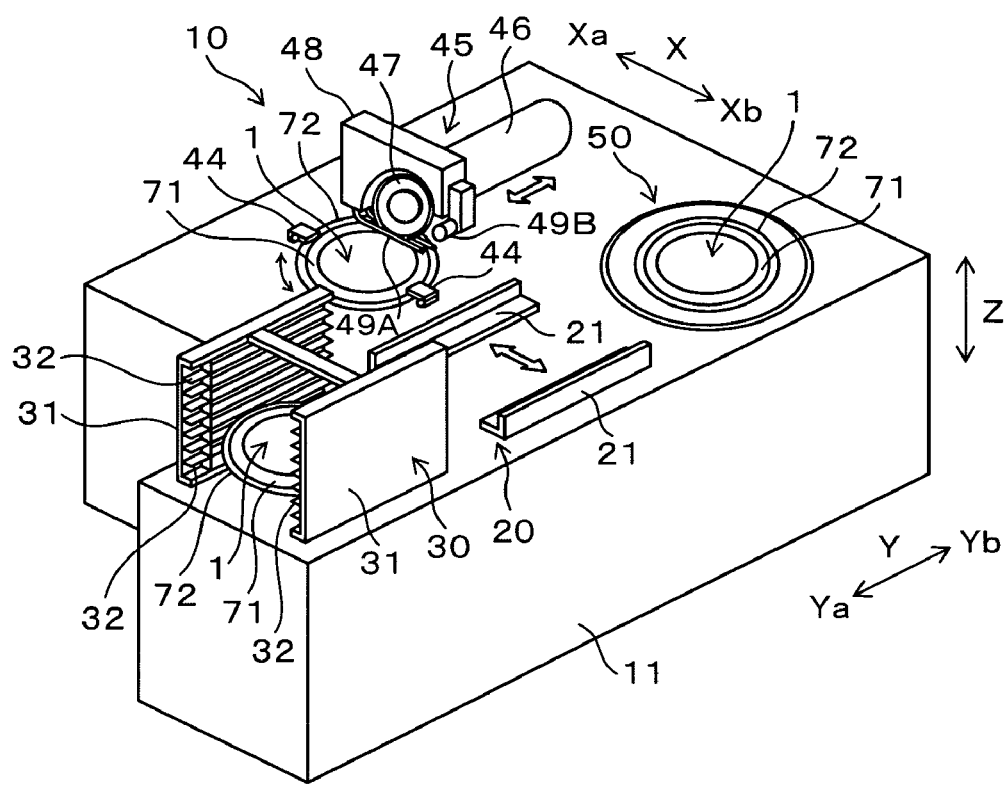
FIG. 9 is a perspective view showing a practical condition in which a circumferential edge of the wafer having the dicing tape and the dicing frame provided thereon is cut off by using the cutting apparatus shown in FIG. 2.

FIG. 9 shows a practical condition in which the wafer 1 having the dicing tape 71 and the dicing frame 72 provided thereon is subjected to cutting for removing the circumferential edge thereof. The dicing tape 71 and the dicing frame 72 holding the wafer 1 are provided in the above cassette 30. In the above same manner as in the above embodiments, the wafer 1 is moved together with the dicing tape 71 and the dicing frame 72 from the cassette 30, and is subjected to the cutting for removing the circumferential edge thereof. For example, the edge thickness of the cutting blade 47 used in the cutting mechanism 40 is about 0.3 mm. In this case, a clamp 44 is provided to the table base 41 so as to control a vertical movement of the dicing frame 72.

What is claimed is:

1. A cutting method for substrates, comprising:
   preparing a substrate having a predetermined circular cut line which is set on a surface of the substrate;
   chucking the substrate on a surface of a chuck table which is rotatably provided; and
   cutting the substrate along the predetermined circular cut line of the substrate by rotating a disc-shaped cutting blade, wherein in the cutting, the cutting blade is disposed beforehand laterally away from a side of the substrate in a surface direction of the substrate and is disposed beforehand at a position in a thickness direction of the substrate, the position corresponding to a cut depth by the cutting blade to the substrate,
   the cutting blade is moved relatively from the above condition toward the substrate in a tangential direction of the substrate so as to enter from an edge of the substrate to a cutting start point of the substrate, and
   the substrate is rotated together with the chuck table and the cutting blade cuts the substrate along the predetermined circular cut line, so that the cutting is performed on the substrate;
   wherein the predetermined circular cut line is positioned inside a predetermined distance from the edge of the substrate on the surface of the substrate; and
   the cutting start point is positioned on the predetermined circular cut line.

2. A cutting method for substrates according to claim 1, wherein an entry speed of the cutting blade into the substrate is 1 to 10 mm/sec.

3. A cutting method for substrates according to claim 1, wherein by the cutting by the cutting blade, one of a ring-shaped groove and a ring-shaped step is formed at a circumferential edge of the substrate.

4. A cutting method for substrates according to claim 1, wherein in the cutting by the cutting blade, the substrate is disc-shaped by cutting and removing an entire circumferential edge from the substrate.

5. A cutting method for substrates according to claim 4, wherein in the cutting by the cutting blade, a dicing tape having a dicing frame provided thereon is applied on a rear surface of the substrate.

* * * * *